United States Patent [19]

Egawa et al.

[11] Patent Number: 4,678,114

[45] Date of Patent: * Jul. 7, 1987

[54] METHOD OF WIRE BONDING WITH APPLIED INSULATIVE COATING

[75] Inventors: Hideharu Egawa, Tokyo; Katsuya Okumura, Yokohama, both of Japan

[73] Assignee: Kabushiki Kaisha Toshiba, Kawasaki, Japan

[*] Notice: The portion of the term of this patent subsequent to Dec. 18, 2001 has been disclaimed.

[21] Appl. No.: 664,373

[22] Filed: Oct. 24, 1984

Related U.S. Application Data

[63] Continuation of Ser. No. 423,283, Sep. 24, 1982, Pat. No. 4,488,674.

[30] Foreign Application Priority Data

Oct. 12, 1981 [JP] Japan ................................ 56-162197

[51] Int. Cl.$^4$ ............................................. H01L 21/60
[52] U.S. Cl. .................................... 228/176; 228/179; 228/203; 29/850
[58] Field of Search ................. 228/1.1, 4.5, 179, 176, 228/203; 29/850

[56] References Cited

U.S. PATENT DOCUMENTS

| | | | |
|---|---|---|---|
| 3,646,367 | 2/1972 | Hazel | 228/4.5 |
| 3,673,681 | 7/1972 | Steranko | 228/4.5 X |
| 4,002,282 | 1/1977 | Murdoch | 228/4.5 |
| 4,013,212 | 3/1977 | Miller | 228/203 |
| 4,098,447 | 7/1978 | Edson et al. | 228/4.5 |
| 4,488,674 | 12/1984 | Egawa et al. | 228/179 |

FOREIGN PATENT DOCUMENTS 128270 10/1979 Japan ................................ 228/179

*Primary Examiner*—Kenneth J. Ramsey
*Attorney, Agent, or Firm*—Finnegan, Henderson, Farabow, Garrett & Dunner

[57] ABSTRACT

The invention provides a bonding wire which prevents electric short-circuiting even if it comes into contact with another bonding wire, a bonding method using the same, and a semiconductor device including the same. The bonding wire comprises a core wire made of a metal and an insulating film which surrounds it. The insulating film is eliminated from the ends of the bonding wire by thermal decomposition and scattering, while simultaneously each end of the bonding wire is connected to a bonding pad of the semiconductor device or to a lead frame. In the semiconductor device, the bonding pads are respectively connected to lead frames by means of the bonding wires.

7 Claims, 5 Drawing Figures

METHOD OF WIRE BONDING WITH APPLIED INSULATIVE COATING

This is a continuation of application Ser. No. 423,283, filed Sept. 24, 1982, now U.S. Pat. No. 4,488,674.

BACKGROUND OF THE INVENTION

I. Field of the Invention

The present invention relates to a bonding wire used for a semiconductor device, a semiconductor device including a bonding wire, and a method for connecting a bonding pad of the semiconductor device to a lead frame.

II. Description of the Prior Art

A semiconductor device such as an IC (integrated circuit) generally includes a chip into which a semiconductor element is built, a plurality of bonding pads for leading electrodes, and a lead frame disposed to surround the chip. The bonding pads are respectively electrically connected to the lead frame by means of bonding wires. The conventional bonding wire consists of a bare gold or aluminum wire.

Along with the development of a high packing density of the IC, the distance between adjacent bonding pads has decreased. For example, in a large scale integrated circuit (LSI), the pitch of bonding pads is often less than 200 μm. In this manner, as the pitch of bonding pads is decreased, adjacent bonding wires come closer to each other. In the process of bonding and/or a subsequent process, adjacent bonding wires may come into contact with each other, resulting in short-circuiting and erratic operation of the semiconductor device.

SUMMARY OF THE INVENTION

It is, therefore, an object of the present invention to provide a bonding wire which may not electrically be short-circuited with another bonding wire even if these bonding wires are brought into contact with each other.

It is another object of the present invention to provide a semiconductor device which includes the bonding wire as described above.

It is still another object of the present invention to provide a method for connecting a bonding pad to a lead frame by means of a bonding wire, whereby electric short-circuiting due to bonding wire contact is prevented.

According to the present invention a bonding wire is provided, comprising a core wire made of a metal and an insulating film which surrounds the core wire.

This invention also provides a semiconductor device wherein a bonding pad is connected to a lead frame by the bonding wire as described above.

This invention further provides a method for connecting a bonding pad to a lead frame, comprising the steps of peeling off an insulating film from the two ends of the bonding wire and bonding each of the two ends to the bonding pad and the lead frame, respectively.

Since the bonding wire of the present invention is covered with the insulating film, electrical short-circuiting does not occur even if the bonding wires come into contact with each other. As a result, a highly reliable semiconductor device is obtained.

DETAILED DESCRIPTION OF THE PREFERRED EMBODIMENTS

Figure 1:
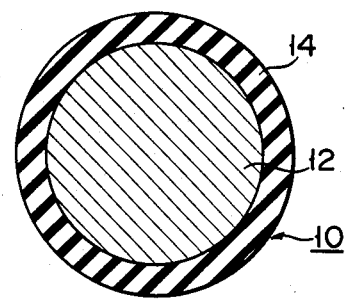
FIG. 1 is a cross-sectional view of a bonding wire according to the present invention.

Preferred embodiments of the present invention will be described with reference to the accompanying drawings. Referring to FIG. 1, a bonding wire 10 of the present invention comprises a metal core wire 12 and an insulating film 14 which surrounds it. The core wire 12 may be a general bonding wire which has been conventionally used for bonding in semiconductor devices such as ICs. The diameter of the core wire 10 is generally 15 to 50 μm. The core wire 12 is generally made of gold or aluminum as in the conventional bonding wire.

The core wire 12 is surrounded by the insulating film 14. The insulating film 14 is preferably made of a flexible resin. The thickness of the insulating film 14 is preferably 1 to 10 μm. It is difficult to form a film of less than 1 μm thickness. On the other hand, if the thickness of the film is greater than 10 μm, cracks tend to occur and the film tends to become removed from the core wire 12. The insulating film 14 is preferably made of a resin which is thermally stable at temperatures below 200° C., and which is thermally decomposed and scattered at a temperature of 200° to 300° C., for the following reason. For bonding the bonding wire 10 of the present invention to the bonding pad and the like, the insulating film on those portions of the bonding wire 10 to be bonded must be peeled off. The bonding portion of the wire reaches a temperature of at least 300° C. in accordance with conventional nail head bonding or ultrasonic bonding. If the insulating film 14 is made of a resin which is thermally decomposed and scattered at temperatures below 300° C., the insulating film 14 on the bonding portion of the wire is scattered away by heat when the bonding wire is bonded by the conventional bonding method. Thus, a special process for peeling off the insulating film 14 is not required. In other words, the insulating film 14 is simultaneously thermally decomposed and scattered when bonding is performed. Therefore, a conventional bonding apparatus can be used for this bonding wire, resulting in convenience. The semiconductor device such as an IC sometimes reaches temperatures around 200° C. in operation. Thus, the resin for forming the insulating film 14 is preferably thermally stable at temperatures below 200° C. It is easy for those who are skilled in the art to find a resin which is flexible, which is thermally decomposed and scattered at a temperature of 200° to 300° C. and which is stable under the temperature of less than 200° C., examples of which may include:

(A) Polyethyleneterephthalate, represented by the following formula:

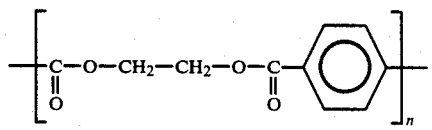

The average molecular weight is preferably about 13,000. The above resin is commercially available as Lumirror manufactured by Toray Inc.

(B) Polycarbonate, represented by the following formula:

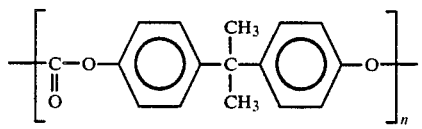

The average molecular weight is about 50,000 to 150,000. Other types of polycarbonates are known apart from the polycarbonate having the above formula. Melting points of these polycarbonates and their other properties are known. Any such polycarbonate which satisfies the above condition can be used.

(C) Polystyrene, indicated by the following formula:

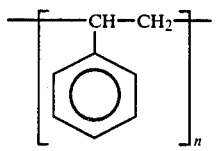

The average molecular weight is preferably about 100,000.

Figure 2:
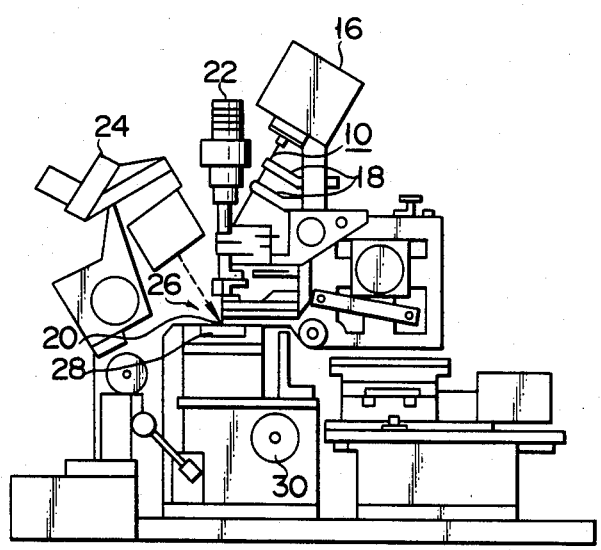
FIG. 2 is a view of an example of a bonding apparatus used for the method of the present invention.

When a bonding wire is used which has an insulating film 14 made of one of the resins having the above-described properties, the conventional bonding apparatus can be used without any modification. FIG. 2 shows an example of the apparatus used in the method of the present invention. The bonding apparatus has a wire case 16 at its upper portion. A bonding wire 10 is stored in the wire case 16. The bonding wire 10 supplied from the wire case 16 is clamped between two wire clampers 18 and extends downward. The lowermost end of the bonding wire 10 reaches a bonding unit 26 through a capillary 20. The bonding unit 26 is illuminated by light from a light source 22. The operator can observe the bonding unit 26 through a microscope 24. A feeder 28 is disposed in the bonding unit 26. The chip to be bonded is placed on the feeder 28 which is moved by a motor 30.

Figure 3:
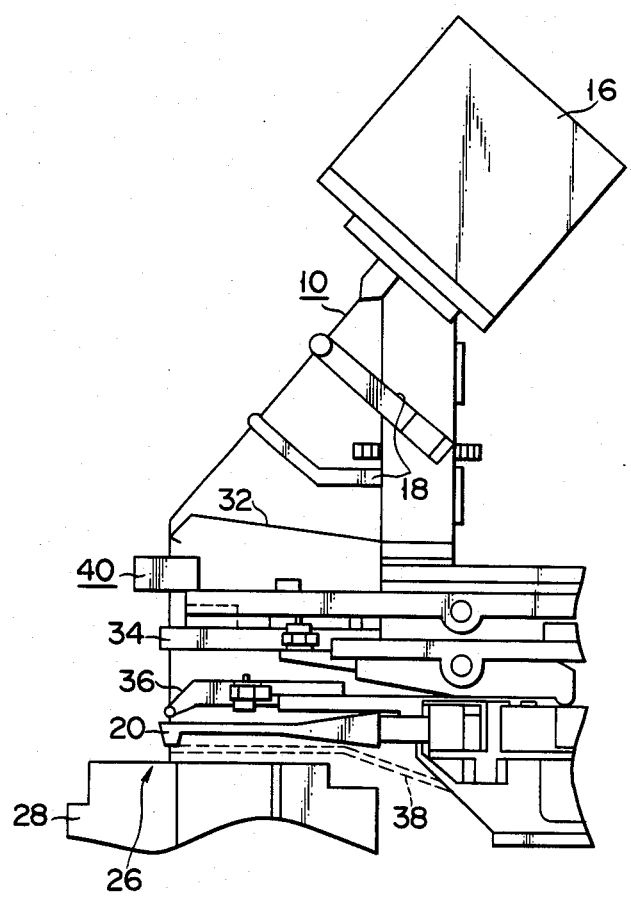
FIG. 3 is an enlarged view of part of the apparatus shown in FIG. 2.

FIG. 3 is an enlarged view showing part of the apparatus from the wire case 16 to the bonding unit 26. The bonding wire 10 supplied from the wire case 16 is clamped between the wire clampers 18 and is guided by wire guides 32 and 34. The bonding wire 10 is then clamped between wire clampers 36 and is supplied to the feeder 28 through the capillary 20. When nail head bonding is performed, a hydrogen torch 38 is disposed below the capillary 20. However, when ultrasonic bonding is performed, ultrasonic waves are applied to the capillary 20. Since the bonding apparatus has been widely used for conventional bonding of ICs, further details thereof will be omitted.

End portions of the insulating film 14 are peeled off and corresponding portions of the bonding wire 10 are exposed. An exposed core wire 12 is bonded to the bonding pad or the lead frame. Conventional bonding methods include nail head bonding and ultrasonic bonding. According to nail head bonding, the distal end of the bonding wire is heated by the hydrogen torch to form a melted ball at the distal end of the wire. The ball is brought into contact with the bonding pad or the like and a solid-phase diffusion occurs. Gold wire is generally bonded by nail head bonding. Furthermore, 1.2% by weight of silicon is usually added to the gold to improve the mechanical strength of the gold wire. According to ultrasonic bonding, the distal end of the bonding wire 10 is brought into tight contact with the bonding pad by means of the capillary 20 (FIG. 3), and the ultrasonic waves are applied to the capillary 20. The wire is heated by ultrasonic vibration and is welded. An aluminum wire is generally bonded by ultrasonic bonding.

If the insulating film 14 is made of a resin which is thermally decomposed and scattered at a temperature of 200° to 300° C., the insulating film 14 can be removed simultaneously when bonding is performed, as in nail head bonding or ultrasonic bonding, since the insulating film 14 is thermally decomposed and scattered due to the bonding heat. Therefore, a separate step for peeling off the insulating film 14 need not be performed, resulting in convenience. If ultrasonic bonding is used, ultrasonic energy or the urging force of the wire to the bonding pad or the like is preferably increased by 20% as compared with bonding of the bare wire.

Figure 4:
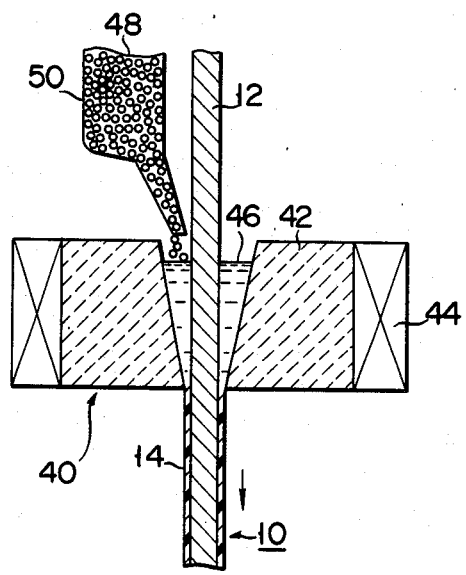
FIG. 4 is a view for explaining a method for forming a bonding wire according to the present invention.

The method for forming the bonding wire according to the present invention will be described with reference to FIG. 4. An insulating film forming member 40 includes a cylindrical refractory member 42 and a heater 44 which surrounds it. A through hole 46 is formed in the refractory member 42. The through hole 46 is tapered toward the lower part. The inner diameter of the through hole 46 at the lower most end of the refractory member 42 is slightly greater than the diameter of the core wire 12 of the bonding wire 10. The core wire 12 is inserted through the through hole 46. A solid (e.g., granular) resin 48 as a material for the insulating film 14 is filled into a space defined between the core wire 12 and the inner wall of the through hole 46. The resin 48 is stored in a resin container 50. The refractory member 42 is externally heated by the heater 44 to melt the resin 48. At the same time, the core wire 12 is moved downward. A melted resin film is formed on the outer surface of the core wire 12 and is cooled and hardened to form the insulating film 14. The core wire 12 is continuously moved downward; in response to this, the solid resin 48 is continuously supplied from the resin container 50.

The insulating film forming member 40 can be mounted on the bonding apparatus described with reference to FIGS. 2 and 3. As shown in FIG. 3, the insulating film forming member 40 is disposed immediately beneath the wire guides 32. The formation of the insulating film 14 and bonding can thus be simultaneously performed. However, the bonding wire 10 having the insulating film 14 may be formed beforehand and may be supplied to the bonding apparatus.

Figure 5:
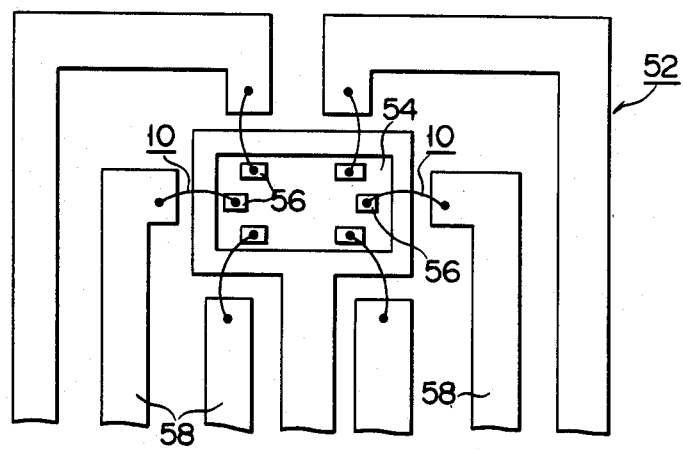
FIG. 5 is a schematic view of a semiconductor device according to the present invention.

FIG. 5 shows an example of the semiconductor device according to the invention which includes the bonding wire of the present invention. A semiconductor device 52 has a chip which has a semiconductor element therein. A plurality of bonding pads 56 for electrodes are formed on the chip 54. Lead frames 58 are disposed around the chip 54. Each bonding pad 56 and the distal end of each lead frame 58 are connected by the bonding wire 10. Since the bonding wire 10 is covered with the insulating film in the semiconductor device 52, electrical short-circuiting does not occur even if the bonding wires come into contact with each other. Thus, a highly reliable semiconductor device can be obtained. Especially in a highly integrated semiconductor device where the pitch of the bonding pads is less than 200 μm, bonding wires tend to be brought into contact with each other. Therefore, it is especially significant to use the bonding wire of the present invention for such a highly integrated semiconductor device since the reliability of the semiconductor device can largely be promoted.

What we claim is:

1. A method for connecting a bonding pad to a lead frame of a semiconductor device through a bonding wire, comprising the steps of:
   providing a bonding wire which has a core wire made of a metal and an insulating film which surrounds said core wire, said insulating film being made of a flexible resin which is thermally stable at temperatures below 200° C., and which thermally decomposes and scatters at a temperature of 200° to 300° C.;
   thermally decomposing and scattering one end portion of said insulating film of said bonding wire and thereafter bonding the one end portion of said core wire which is exposed to said bonding pad by a nail head bonding method; and
   bonding the other end portion of said core wire to said lead frame.

2. The method according to claim 1, wherein the diameter of said core wire is 15 to 50 μm.

3. The method according to claim 1, wherein said resin is a material selected from the group consisting of polyethylenephthalate, polycarbonate and polystyrene.

4. The method according to claim 3, wherein the step of providing said bonding wire comprises the steps of:
   providing a refractory member which has a through hole of which inner diameter is tapered downward, the inner diameter of said through hole at a lowermost end of said refractory member being slightly larger than the diameter of said core wire;
   inserting said core wire through said through hole;
   filling with said resin of a solid phase a space defined between said core wire and an inner wall of said through hole;
   externally heating said refractory member to melt said resin; and
   moving said core wire downward to form said insulating film around said core wire.

5. The method according to claim 1, wherein said core wire is made of aluminum.

6. The method according to claim 1, wherein said core wire is made of gold.

7. The method according to claim 1, wherein the step of providing said bonding wire comprises the steps of:
   providing a refractory member which has a through hole of which inner diameter is tapered downward, the inner diameter of said through hole at a lowermost end of said refractory member being slightly larger than the diameter of said core wire;
   inserting said core wire through said through hole;
   filling with said resin of a solid phase a space defined between said core wire and an inner wall of said through hole;
   externally heating said refractory member to melt said resin; and
   moving said core wire downward to form said insulating film around said core wire.

* * * * *